(12) United States Patent
He et al.

(10) Patent No.: US 12,191,225 B2
(45) Date of Patent: Jan. 7, 2025

(54) BALL GRID ARRAY PACKAGE DESIGN

(71) Applicant: DELL PRODUCTS L.P., Round Rock, TX (US)

(72) Inventors: Qinghong He, Austin, TX (US); Isaac Q. Wang, Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 18/375,750

(22) Filed: Oct. 2, 2023

(65) Prior Publication Data

US 2024/0030091 A1 Jan. 25, 2024

Related U.S. Application Data

(62) Division of application No. 17/235,486, filed on Apr. 20, 2021, now Pat. No. 11,837,522.

(51) Int. Cl.
| | | |
|---|---|---|
| H01L 23/367 | (2006.01) | |
| H01L 21/50 | (2006.01) | |
| H01L 23/14 | (2006.01) | |
| H01L 23/522 | (2006.01) | |
| H01L 23/528 | (2006.01) | |
| H05K 1/02 | (2006.01) | |
| H05K 1/11 | (2006.01) | |
| H01L 23/538 | (2006.01) | |
| H01L 25/065 | (2023.01) | |

(52) U.S. Cl.
CPC .......... *H01L 23/3677* (2013.01); *H01L 21/50* (2013.01); *H01L 23/14* (2013.01); *H01L 23/5226* (2013.01); *H01L 23/528* (2013.01); *H05K 1/0201* (2013.01); *H05K 1/115* (2013.01); *H01L 23/5385* (2013.01); *H01L 25/0657* (2013.01); *H01L 2224/0554* (2013.01); *H01L 2224/32145* (2013.01); *H01L 2924/15311* (2013.01)

(58) Field of Classification Search
CPC ..... H01L 23/3677; H01L 21/50; H01L 23/14; H01L 23/5226; H01L 23/528; H01L 23/5385; H01L 25/0657; H01L 2924/15311; H01L 23/13; H01L 23/49827; H01L 23/427; H01L 2224/32145; H01L 2224/0554; H05K 1/0201; H05K 1/115; H05K 2201/09054; H05K 2201/10734; H05K 1/021
See application file for complete search history.

(56) References Cited

U.S. PATENT DOCUMENTS

| | | | |
|---|---|---|---|
| 5,516,030 A | 5/1996 | Denton | |
| 7,462,933 B2 | 12/2008 | Zhao et al. | |
| 2005/0280128 A1* | 12/2005 | Mok | H01L 23/427 257/E23.088 |
| 2006/0115928 A1* | 6/2006 | Nguyen | H01L 25/0657 257/E21.705 |
| 2018/0253125 A1* | 9/2018 | Morrison | H05K 7/20 |
| 2019/0115281 A1* | 4/2019 | Lee | H01L 23/427 |

* cited by examiner

*Primary Examiner* — Patricia D Valenzuela
(74) *Attorney, Agent, or Firm* — Larson Newman, LLP

(57) ABSTRACT

An information handling system includes a printed circuit board (PCB) and an integrated circuit device. The integrated circuit device includes a substrate and a die that is bonded via a first surface of the die to a first surface of the substrate. The substrate includes a ball grid array (BGA) on the first surface of the substrate. The integrated circuit device is bonded to a first surface of the PCB via the BGA. The die is collocated with the cutout area.

20 Claims, 3 Drawing Sheets

BALL GRID ARRAY PACKAGE DESIGN

CROSS-REFERENCE TO RELATED APPLICATION

This application is a Divisional of U.S. patent application Ser. No. 17/235,486 entitled "BALL GRID ARRAY PACKAGE DESIGN" filed Apr. 20, 2021, the disclosure of which is hereby expressly incorporated by reference in its entirety.

FIELD OF THE DISCLOSURE

This disclosure generally relates information handling systems, and more particularly relates to ball grid array (BGA) packaging of electronic components in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a printed circuit board (PCB) and an integrated circuit device. The integrated circuit device may include a substrate and a die that is bonded via a first surface of the die to a first surface of the substrate. The substrate may include a ball grid array (BGA) on the first surface of the substrate. The integrated circuit device may be bonded to a first surface of the PCB via the BGA. The die may be collocated with the cutout area.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
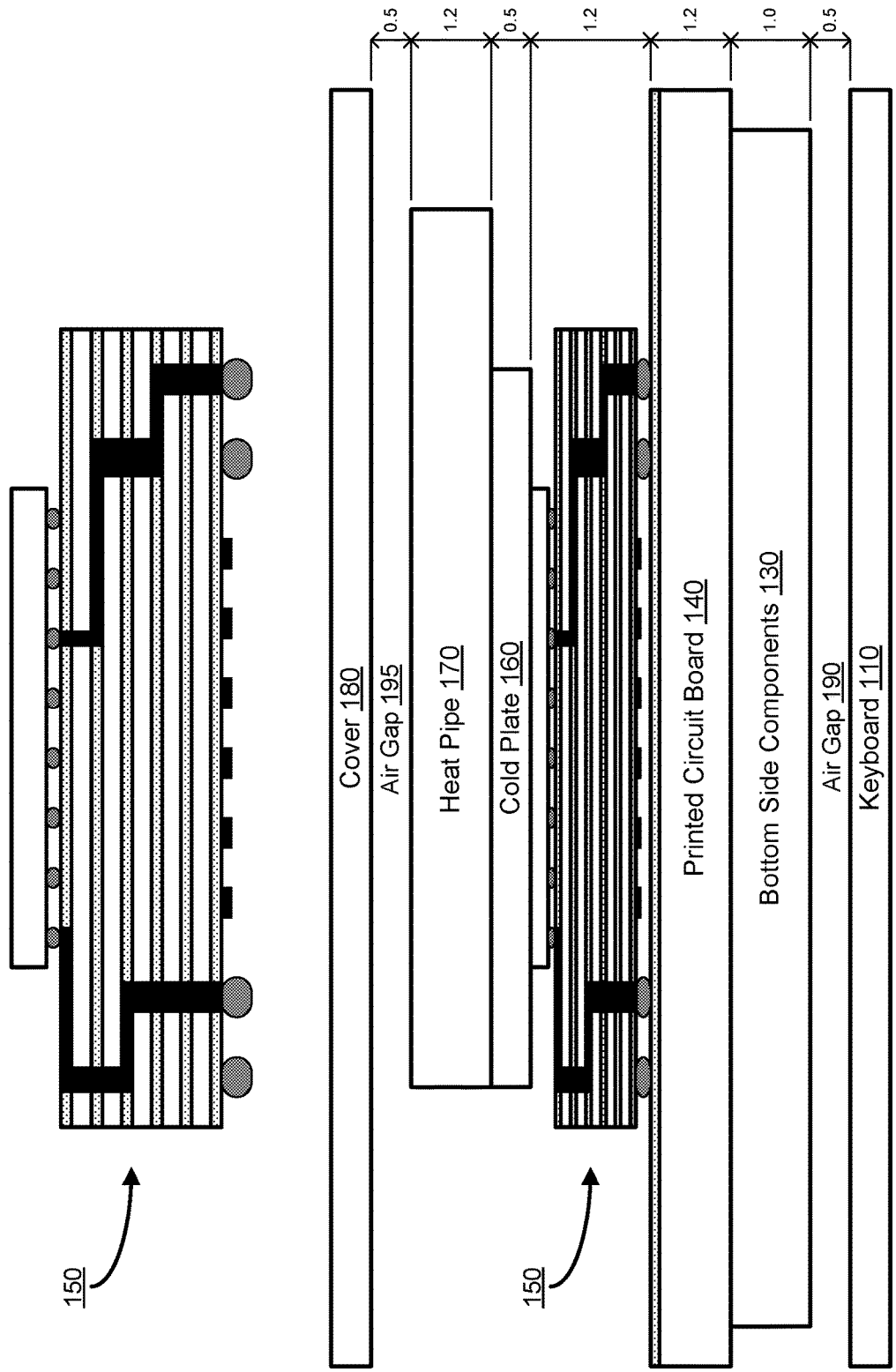
FIG. 1 is a block diagram illustrating an information handling system in accordance with the prior art.

FIG. 1 illustrates a sectional view of an information handling system 100 in accordance with the prior art. FIG. 1 is provided for illustrative purposes and should not be understood to provide a scaled illustration. Information handling system 100 represents an electronic device that is designed to provide a low profile, compact design, such as a laptop computer, a tablet device, a cellular device, or other compact electronic device. Information handling system 100 includes a keyboard 110, bottom side components 130, a printed circuit board (PCB) 140, a ball grid array (BGA) device 150, a cold plate 160, a heat pipe 170, and a cover 180. Keyboard 110 and cover 180 make up an enclosure for housing the components of information handling system 100. It will be understood that, as used herein, the terms "top" and "bottom" are provided in relation to the current figures, and that, in a typical information handling system, the keyboard will likely be arranged on a different surface than illustrated herein.

PCB 140 is affixed between keyboard 110 and cover 180, and the components of information handling system 100 are affixed to the PCB by, for example, a surface mount assembly process. In particular, on a bottom surface of PCB 140, various bottom side components 130 are affixed. Information handling system 100 will be understood to be designed with the intent to permit cooling air to flow around bottom side components 130, and that thus the information handling system will be in conformance with a specified minimum air gap 190 between the tallest component of the bottom side components and keyboard 110.

BGA device 150 represents an integrated circuit device that is packaged in a conventional package, and may represent a central processing unit (CPU), a graphics processor, an I/O hub, or another highly integrated device, as needed or desired. BGA device 150 includes a device die that is fabricated to provide the functions and features of the BGA device, and that is affixed to a top surface of a substrate via electrical contact bumps, bond wires, or the like. The substrate is fabricated of patterned layers of metal sandwiched between layer of an insulating material. The patterned metal layers are interconnected with vias to provide circuit paths between the electrical contact bumps of the device die and a ball grid array (BGA) of solder contact pads on the bottom side of the substrate which includes solder balls that get soldered to patterned contacts on a top metallization layer of PCB 140.

As illustrated, BGA device 150 includes capacitors, resistors, or other discrete components that are soldered to the bottom side of the substrate. BGA device 150 is characterized by the fact that the device die generates a large amount of heat when in operation that needs to be dissipated from the device die. As such, cold plate 160 is thermally attached to the top surface of the die of BGA device 150, and heat pipe 170 is thermally attached to the top surface of the cold plate. Information handling system 100 will be understood to be designed with the intent to permit cooling air to flow around cold plate 160, heat pipe 170, and the components affixed to the top surface of PCB 140, and that thus the information handling system will be in conformance with a specified minimum air gap 195 between the heat pipe 170 and cover 180. As such, it will be understood that there is a minimum distance between the top of keyboard 110 and the bottom of cover 180. Table 1 provides an example of the stack up distances and the minimum distance.

TABLE 1

Stack Up Distances

| Components | Stack Up Height |
|---|---|
| Heat Pipe to Cover | 0.5 mm |
| Heat Pipe | 1.2 mm |
| Cold Plate | 0.5 mm |
| BGA device | 1.2 mm |
| PCB | 1.2 mm |
| Bottom Side Components | 1.0 mm |
| Bottom Side Components to Keyboard | 0.5 mm |
| Total | 6.1 mm |

BGA device 150 is illustrated with the depth expanded to illustrate the circuit paths between the contact bumps on the bottom side of the device die and the contact pads on the bottom side of the substrate. Thus BGA device 150 necessitates that all of the circuit paths transit through all of the internal layers of the substrate. Such a routing scheme drives up the substrate layer count and increases the overall cost of the prior art BGA device. Further, the overall thickness the information handling system of the prior art is difficult to reduce, because reductions in any of the dimensions is difficult to achieve without limiting the performance or functionality of the other components.

For example, decreasing air gaps 190 and 195 may result in decreased system performance due to overheating of the components of information handling system 100, and may make the exterior surfaces of keyboard 110 and cover 180 uncomfortably hot for the user of the information handling system. Further, reducing the layer count of PCB 140 may achieve an overall thinner structure, but such a reduction is typically done by reducing the number of metallization layers in the PCB which reduces the number of circuit paths that can be achieved, and hence leads to a reduction in the functionality of information handling system 100. Moreover, reducing the depth of either cold plate 160 or heat pipe 170 typically results in higher operating temperatures of the device die of BGA device 150, leading to decreased system performance of information handling system 100.

Figure 2:
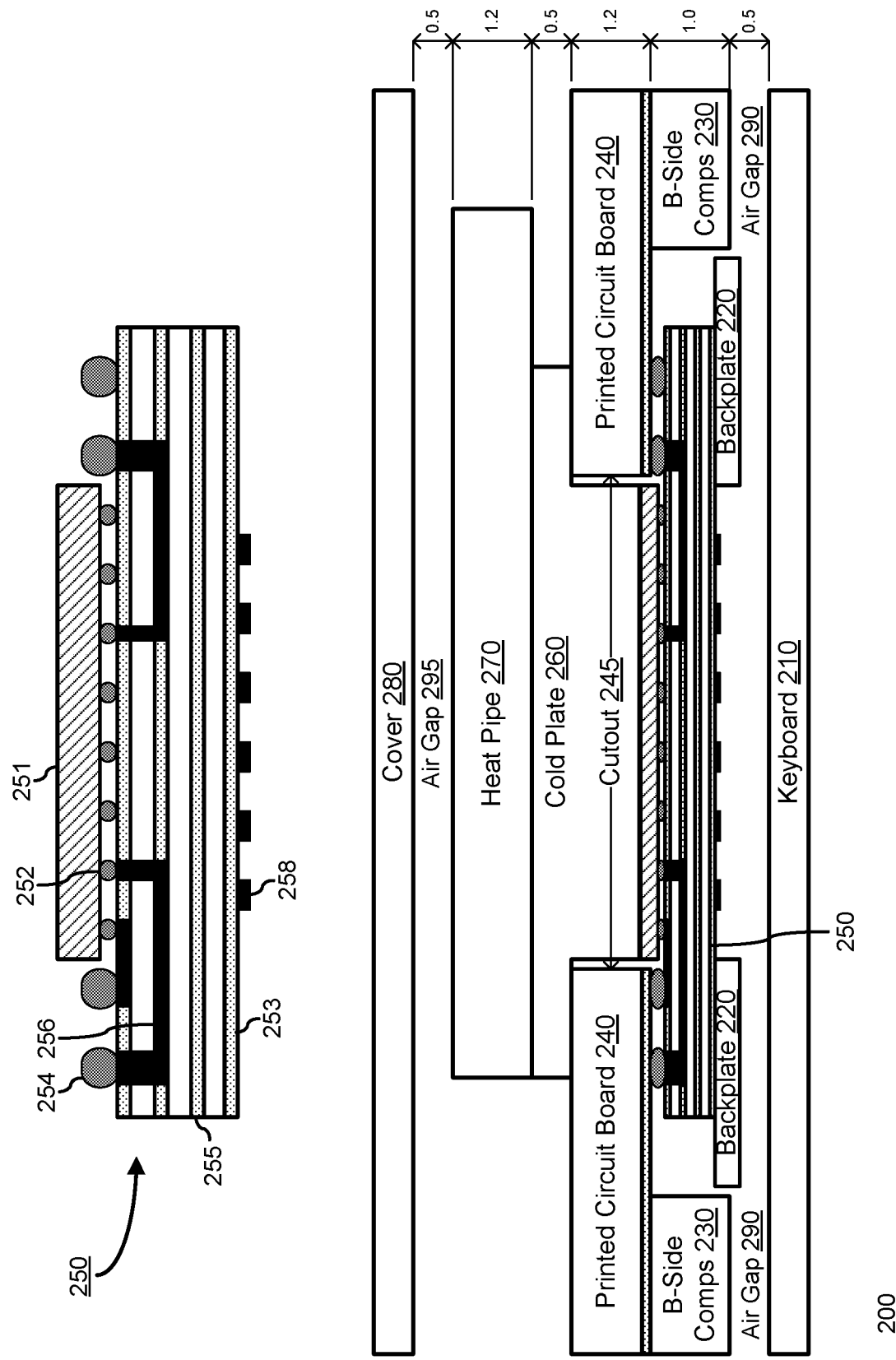
FIG. 2 is a block diagram illustrating an information handling system according to an embodiment of the current disclosure.

FIG. 2 illustrates a sectional view of an information handling system 200 in accordance with an embodiment of the current disclosure. FIG. 2 is provided for illustrative purposes and should not be understood to provide a scaled illustration. Information handling system 200 is similar to information handling system 100, and includes a keyboard 210, a backplate 220, bottom side components 230, a PCB 240, a BGA device 250, a cold plate 260, a heat pipe 270, and a cover 280. Keyboard 210 and cover 280 make up an enclosure for housing the components of information handling system 200. PCB 240 is affixed between keyboard 210 and cover 280, and the components of information handling system 200 are affixed to the PCB by, for example, a surface mount assembly process. In particular, on a bottom surface of PCB 240, various bottom side components 230 are affixed. Information handling system 200 will be understood to be designed with the intent to permit cooling air to flow around bottom side components 230, and that thus the information handling system will be in conformance with a specified minimum air gap 290 between the tallest component of the bottom side components and keyboard 210.

BGA device 250 is similar to BGA device 150, and includes a device die that is fabricated to provide the functions and features of the BGA device, and that is affixed to a top surface of a substrate via electrical contact bumps. The substrate is fabricated of patterned layers of metal sandwiched between layers of an insulating material. The patterned metal layers are interconnected with vias to provide circuit paths between the electrical contact bumps of the device die and a ball grid array (BGA) of solder contact pads. However, here, the BGA is on the top side of the substrate which includes solder balls that soldered to patterned contacts on the bottom metallization layer of PCB 240, and the PCB is fabricated with a cutout area 245 that accommodates the device die within the cutout area. As illustrated, BGA device 250 includes capacitors, resistors, or other discrete components soldered to the bottom side of the substrate.

BGA device 250 is characterized by the fact that the device die generates a large amount of heat when in operation that needs to be dissipated from the device die. As such, cold plate 260 is thermally attached to the top surface of the die of BGA device 250, and heat pipe 270 is thermally attached to the top surface of the cold plate. Information handling system 200 will be understood to be designed with the intent to permit cooling air to flow around cold plate 260, heat pipe 270, and the components affixed to the top surface of PCB 240, and that thus the information handling system will be in conformance with a specified minimum air gap 295 between the heat pipe 270 and cover 280. However, here, cold plate 260 is fabricated in such a way that the bottom surface of the cold plate goes through cutout area 245 from the top side of the PCB to come into thermal contact with the top side of the device die of BGA device 250.

As such, there is a minimum distance between the top of keyboard 210 and the bottom of cover 280. Here, because BGA device 250 is affixed to the bottom surface of PCB 140 and cold plate 260 extends through cutout area 245 to come into thermal contact with the top surface of the device die of the BGA device, the overall stack up is reduced by "hiding" the depth of the BGA device and the cold plate and a portion of the cold plate within the depth of the PCB. Backplate 220 operates to provide mechanical stability to the assembly of information handling system 200. For example, note that in information handling system 100, compression from cold plate 160 acts to compress BGA device 150 into PCB 140, while in information handling system 200, the compression from cold plate 260 places BGA device 250 in tension on the bottom side of PCB 240.

As such, backplate 220 may include mechanical retainers that permit the backplate to compress BGA device 250 into the bottom side of PCB 240, thereby eliminating the tension on the solder connections between the BGA device and the PCB. Here, backplate 220 may be in contact with keyboard 210, as needed or desired, however this is not necessarily so, and the backplate may have a thinner depth, or may be affixed to a keyboard support element, not illustrated. Table 2 provides an example of the stack up distances and the minimum distance.

TABLE 2

Stack Up Distances

| Components | Stack Up Height |
| --- | --- |
| Heat Pipe to Cover | 0.5 mm |
| Heat Pipe | 1.2 mm |
| Cold Plate | 0.5 mm |
| PCB | 1.2 mm |
| Bottom Side Components | 1.0 mm |
| Bottom Side Components to Keyboard | 0.5 mm |
| Total | 4.9 mm |

BGA device 250 is illustrated with the depth expanded to illustrate the circuit paths 256 between the contact bumps 252 on the bottom side of the device die 251 and the contact pads 254 (i.e., the ball grid array) on the top side of the substrate 253. Thus BGA device 250 does not require that all of the circuit paths transit through all of the internal layers of the substrate 253. As such, it may be possible to reduce the substrate layer count, including a decrease in the number of metallization layers 255, and to decrease the overall cost of BGA device 250 as compared with BGA device 150. BGA device 250 includes other elements 258, such as capacitors, resistors, or the like, on the bottom surface of the substrate 253.

Figure 3:
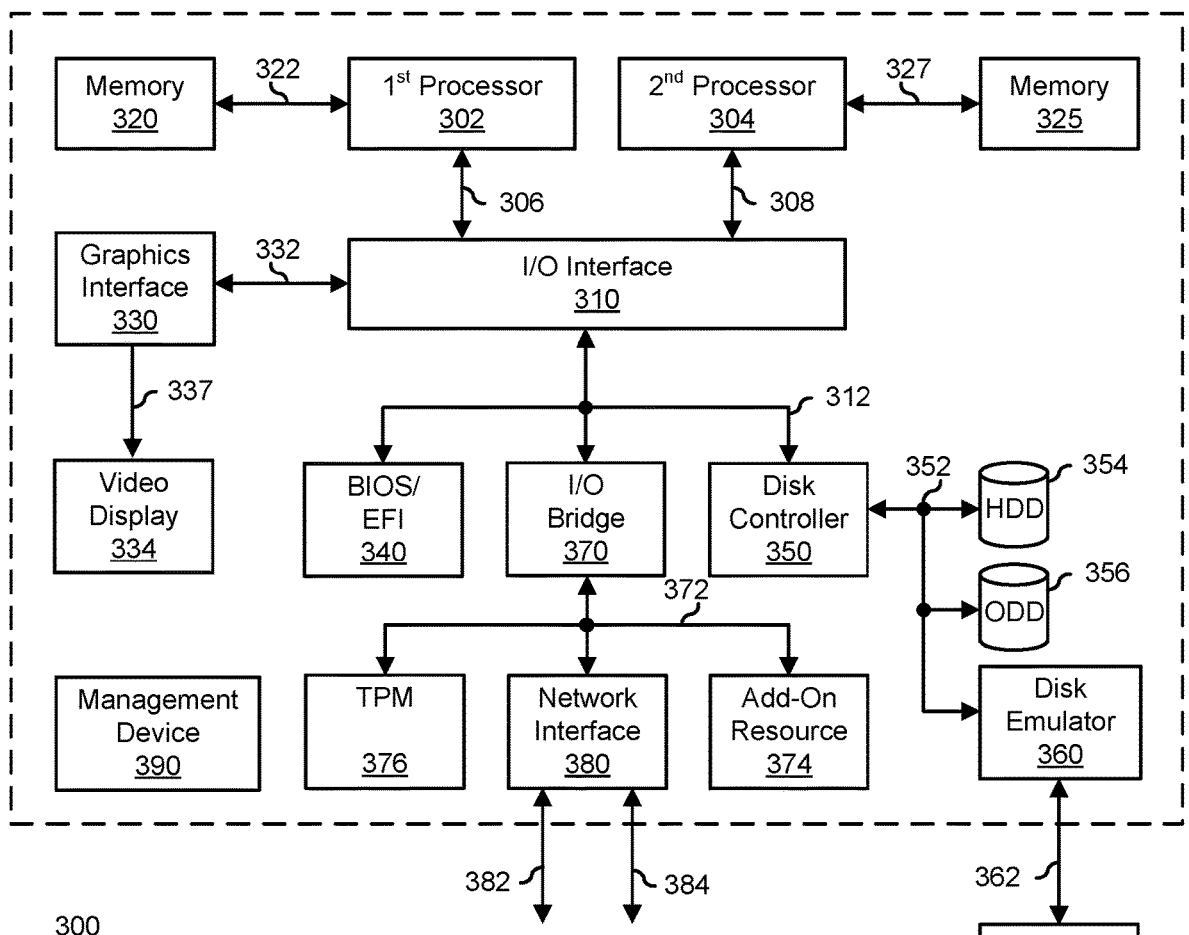
FIG. 3 is a block diagram illustrating a generalized information handling system according to another embodiment of the current disclosure.

FIG. 3 illustrates a generalized embodiment of an information handling system 300. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware. Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes a processors 302 and 304, an input/output (I/O) interface 310, memories 320 and 325, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 364, an I/O bridge 370, one or more add-on resources 374, a trusted platform module (TPM) 376, a network interface 380, and a management device 390. Processors 302 and 304, I/O interface 310, memory 320, graphics interface 330, BIOS/UEFI module 340, disk controller 350, HDD 354, ODD 356, disk emulator 360, SSD 364, I/O bridge 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to I/O interface 310 via processor interface 306, and processor 304 is connected to the I/O interface via processor interface 308. Memory 320 is connected to processor 302 via a memory interface 322. Memory 325 is connected to processor 304 via a memory interface 327. Graphics interface 330 is connected to I/O interface 310 via a graphics interface 332, and provides a video display output 337 to a video display 334. In a particular embodiment, information handling system 300 includes separate memories that are dedicated to each of processors 302 and 304 via separate memory interfaces. An example of memories 320 and 325 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 340, disk controller 350, and I/O bridge 370 are connected to I/O interface 310 via an I/O channel 312. An example of I/O channel 312 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 310 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 1394 (Firewire) interface, a proprietary interface, or a combination thereof. Alternatively, solid-state drive 364 can be disposed within information handling system 300.

I/O bridge 370 includes a peripheral interface 372 that connects the I/O bridge to add-on resource 374, to TPM 376, and to network interface 380. Peripheral interface 372 can be the same type of interface as I/O channel 312, or can be a different type of interface. As such, I/O bridge 370 extends the capacity of I/O channel 312 when peripheral interface 372 and the I/O channel are of the same type, and the I/O bridge translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as I/O interface 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 390 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
    a printed circuit board (PCB) having a cutout area;
    an integrated circuit device including a substrate and a die that is bonded via a first surface of the die to a first surface of the substrate, the substrate including a ball grid array (BGA) on the first surface of the substrate, the integrated circuit device being bonded to a first surface of the PCB via the BGA, wherein the die is collocated with the cutout area; and
    a cold plate extending from a second surface of the PCB through the cutout area, the cold plate being thermally coupled to a second surface of the die.

2. The information handling system of claim 1, wherein the die includes an array of contact bumps on the first surface of the die.

3. The information handling system of claim 2, wherein the die is bonded to the first surface of the substrate via the array of contact bumps.

4. The information handling system of claim 3, wherein the substrate includes a first metal layer, the first metal layer coupling a first contact bump of the array of contact bumps to a first ball of the BGA.

5. The information handling system of claim 4, wherein the substrate includes a second metal layer, the second metal layer coupling a second contact bump of the array of contact bumps to a second ball of the BGA.

6. The information handling system of claim 1, wherein the substrate includes at least one discrete component on a second surface of the substrate.

7. The information handling system of claim 1, further comprising a heat pipe thermally coupled to the cold plate.

8. The information handling system of claim 7, further comprising a cover disposed over the heat pipe, the cover and the heat pipe being separated by a first air gap.

9. The information handling system of claim 8, further comprising a keyboard disposed below the second surface of the PCB, the keyboard and the PCB being separated by a second air gap.

10. The information handling system of claim 1, further comprising a backplate configured to compress the integrated circuit device to the first surface of the PCB.

11. The information handling system of claim 10, wherein the backplate is affixed to the first surface of the PCB.

12. An integrated circuit device, comprising:
a substrate; and
a die that is bonded via a first surface of the die to a first surface of the substrate, the substrate including a ball grid array (BGA) on the first surface of the substrate and a capacitor on a second surface of the substrate.

13. The integrated circuit device of claim 12, wherein the die includes an array of contact bumps on the first surface of the die.

14. The integrated circuit device of claim 13, wherein the die is bonded to the first surface of the substrate via the array of contact bumps.

15. The integrated circuit device of claim 14, wherein the substrate includes a first metal layer, the first metal layer coupling a first contact bump of the array of contact bumps to a first ball of the BGA.

16. The integrated circuit device of claim 15, wherein the substrate includes a second metal layer, the second metal layer coupling a second contact bump of the array of contact bumps to a second ball of the BGA.

17. An information handling system, comprising:
a printed circuit board (PCB) having a cutout area;
an integrated circuit device including a substrate and a die that is bonded via a first surface of the die to a first surface of the substrate, the substrate including a ball grid array (BGA) on the first surface of the substrate, the integrated circuit device being bonded to a first surface of the PCB via the BGA, wherein the die is collocated with the cutout area; and
a cold plate affixed on a second surface of the PCB and extending through the cutout area, the cold plate being thermally coupled to a second surface of the die.

18. The information handling system of claim 17, wherein the die includes an array of contact bumps on the first surface of the die.

19. The information handling system of claim 18, wherein the die is bonded to the first surface of the substrate via the array of contact bumps.

20. The information handling system of claim 19, wherein the substrate includes a first metal layer, the first metal layer coupling a first contact bump of the array of contact bumps to a first ball of the BGA.

* * * * *